United States Patent
Ong et al.

(10) Patent No.: US 8,964,484 B2
(45) Date of Patent: Feb. 24, 2015

(54) FOR TEST (DFT) READ SPEED THROUGH TRANSITION DETECTOR IN BUILT-IN SELF-TEST (BIST) SORT

(71) Applicant: Spansion LLC, Sunnyvale, CA (US)

(72) Inventors: Mee-Choo Ong, Batu Maung (MY);
Sheau-Yang Ch'ng, Penang (MY);
Boon-Weng Teoh, Bayan Lepas (MY);
Sie Wei Henry Lau, Bayan Lepas (MY);
Jih Hong Beh, Bukit Mertajam (MY);
Wei-Kent Ong, Bayan Lepas (MY)

(73) Assignee: Spansion LLC, Sunnyvale, CA (US)

( * ) Notice: Subject to any disclaimer, the term of this patent is extended or adjusted under 35 U.S.C. 154(b) by 187 days.

(21) Appl. No.: 13/729,153

(22) Filed: Dec. 28, 2012

(65) Prior Publication Data

US 2014/0185393 A1 Jul. 3, 2014

(51) Int. Cl.
*G11C 7/22* (2006.01)
*G11C 29/56* (2006.01)
*G11C 29/12* (2006.01)
*G11C 29/44* (2006.01)
*G11C 29/50* (2006.01)

(52) U.S. Cl.
CPC ...... *G11C 29/56012* (2013.01); *G11C 29/1201* (2013.01); *G11C 29/44* (2013.01); *G11C 29/50012* (2013.01)
USPC .............. 365/189.011; 365/233.1; 365/233.5; 365/230.08; 365/241

(58) Field of Classification Search
USPC ........ 365/189.011, 233.1, 233.5, 230.08, 241
See application file for complete search history.

(56) References Cited

U.S. PATENT DOCUMENTS

| | | | |
|---|---|---|---|
| 5,544,101 A * | 8/1996 | Houston | 365/189.02 |
| 7,046,573 B2 * | 5/2006 | Takazawa et al. | 365/229 |
| 7,480,165 B1 * | 1/2009 | Mann | 365/51 |
| 7,499,347 B2 * | 3/2009 | Chen et al. | 365/194 |
| 7,769,943 B2 * | 8/2010 | Surico et al. | 711/103 |
| 8,230,433 B2 | 7/2012 | Chiu et al. | |
| 2005/0017763 A1 | 1/2005 | Slobodnik et al. | |
| 2010/0229055 A1 | 9/2010 | Mukherjee et al. | |
| 2012/0191400 A1 | 7/2012 | Sontakke et al. | |
| 2012/0198294 A1 | 8/2012 | Nadeau-Dostie et al. | |

OTHER PUBLICATIONS

International Search Report and Written Opinion of the International Searching Authority for International Application No. PCT/US2013/077835, mailed Apr. 21, 2014.

* cited by examiner

*Primary Examiner* — Pho M Luu
(74) *Attorney, Agent, or Firm* — Sterne, Kessler, Goldstein & Fox P.L.L.C.

(57) ABSTRACT

A memory operate in a normal mode of operation or a testing mode of operation. In the testing mode of operation, the memory can measure various benchmarks of performance, such as read speed. The memory can perform an asynchronous read operation to read a word of electronic data that corresponds to an address or a page read operation in which multiple asynchronous read operations are performed to read multiple words of electronic data, also referred to as a page of electronic data, that correspond to multiple addresses. The memory can measure a time required, referred to as read speed, to read the word of electronic data or the multiple words of electronic data from the memory. In the normal mode of operation, the memory can perform the asynchronous read operation, the page read operation, an asynchronous write operation in which a word of electronic data is stored into the memory that correspond to the address, or a page write operation in which a page electronic data is stored into the memory that correspond to the multiple addresses.

20 Claims, 6 Drawing Sheets

FOR TEST (DFT) READ SPEED THROUGH TRANSITION DETECTOR IN BUILT-IN SELF-TEST (BIST) SORT

BACKGROUND

1. Field of Disclosure

The present disclosure relates generally to testing of a memory and specifically to measuring a read speed of the memory.

2. Related Art

A memory is an electronic device for reading and/or writing electronic data. Each bit of the electronic data can be read from and/or written into a memory cell. Each of the memory cells can be coupled to one another to form an array of memory cells, or simply a memory, which can be accessible through various control lines that can be selected or toggled to read and/or write the electronic data. The memory can be implemented as volatile memory, such as random access memory (RAM), which requires power to maintain its stored information or non-volatile memory, such as read-only memory (ROM), which can maintain its stored information even when not powered. The RAM can be implemented in a dynamic random-access memory (DRAM), a static random-access memory (SRAM), and/or a non-volatile random-access memory (NVRAM), often referred to as a flash memory, configuration.

The two basic operations performed by the memory are "read", in which the electronic data stored in memory cells that correspond to a memory word is read out, and "write" in which the electronic data is stored in memory cells that correspond to a memory word. During an asynchronous read operation, a memory controller asserts an n bit address of memory cells on address control lines while driving a chip enable control line (CE#) and an output enable control line (OE#). The n bit address is latched by the memory at a falling edge of the CE#. One or more row decoders decode a first portion of the n bit address to read a word of data from memory cells that correspond to the first portion of the n bit address. A column decoder decodes a second portion of the n bit address to access a block of bits from among the word that corresponds to the second portion of the n bit address. During a page read operation, one or more bits the second portion of the n bit address can be sequenced to read multiple words, referred to as a page, of the electronic data.

One benchmark for memory performance is the read speed access time or simply read speed. Design for Test (DFT), also referred to as "Design for Testability", in a context of a memory, supplements a design of a memory with testability features to provide improved access to internal circuit elements of the memory to more easily control and/or observe these internal circuit elements to measure the read speed of the memory.

BRIEF DESCRIPTION OF THE DRAWINGS/FIGURES

The present disclosure is described with reference to the accompanying drawings. In the drawings, like reference numbers indicate identical or functionally similar elements. Additionally, the left most digit(s) of a reference number identifies the drawing in which the reference number first appears.

Figure 1:
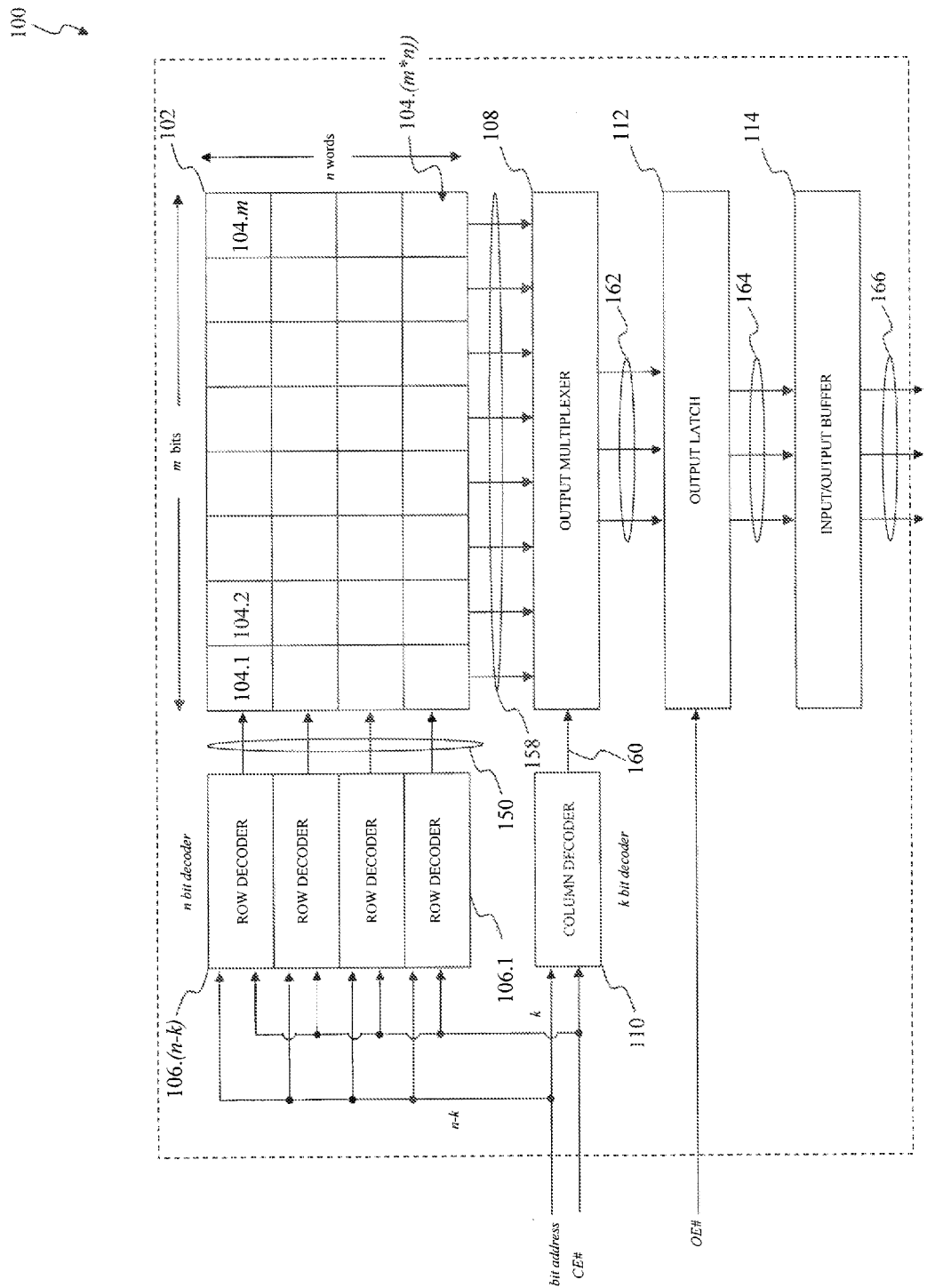
FIG. 1 illustrates a block diagram of a memory operating in a read mode of operation according to an exemplary embodiment of the present disclosure.

The present disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described can include a particular feature, structure, or characteristic, but every exemplary embodiment can not necessarily include the particular feature, structure, or characteristic. Moreover, such phrases are not necessarily referring to the same exemplary embodiment. Further, when a particular feature, structure, or characterstic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications can be made to the exemplary embodiments within the spirit and scope of the disclosure. Therefore, the Detailed Description is not meant to limit the disclosure. Rather, the scope of the disclosure is defined only in accordance with the following claims and their equivalents.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The following Detailed Description of the exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

A Memory Operating in a Read Mode of Operation

FIG. 1 illustrates a block diagram of a memory operating in a read mode of operation according to an exemplary embodiment of the present disclosure. A memory 100 can operate in a read mode of operation to read electronic data from one or more memory cells that are configured to form an array of memory cells, or simply a memory, or in a write mode of operation to write electronic data into the one or more memory cells. In the read mode of operation, the memory 100 reads electronic data from one or more memory cells that correspond to an n-bit address. The memory 100 can be implemented as volatile memory, such as random access memory (RAM), which requires power to maintain the electronic data or non-volatile memory, such as read-only memory (ROM), which can maintain the electronic data even when not powered. The RAM can be implemented as dynamic random-access memory (DRAM), static random-access memory (SRAM), and/or non-volatile random-access memory (NVRAM), often referred to as a flash memory. The memory 100 includes a memory array 102, row decoders 106.1 through 106.($n-k$), an output multiplexer 108, a column decoder 110, an output latch 112, and an input/output (I/O) buffer 114.

During the read mode of operation, a chip enable (CE#) and output enable (OE#) are toggled from a first logical value, such as a logical one to provide an example, to a second logical value, such as a logical zero to provide an example, to cause the memory 100 to perform an asynchronous read operation to read electronic data from the memory array 102. The memory array 102 includes memory cells 104.1 through 104.($m*n$) that are configured to form an array. Each of the memory cells 104.1 through 104.($m*n$) can store one bit or multiple bits of electronic data which can be read by the memory 100 in the read mode of operation. The memory cells 104.1 through 104.($m*n$) are configured into m rows of bits and n columns of words. In an exemplary embodiment, each of the m rows can store 256 bits of electronic data.

The row decoders 106.1 through 106.($n-k$) allow the memory array 102 to access one word of m bits from among n words of electronic data stored in the memory cells 104.1 through 104.($m*n$). In an exemplary embodiment, upon an edge of the CE#, such as a falling edge to provide an example, the row decoders 106.1 through 106.($n-k$) latch the n-k bits of the n bit address. Thereafter, the row decoders 106.1 through 106.($n-k$) provide word control signals 150 to activate the memory cells 104.1 through 104.($m*n$) which correspond to n-k bits of the n bit address. Finally, the memory array 102 provides the one word of m bits from among the n words as a word of electronic data 158.

The column decoder 110 allows the output multiplexer 108 to access a subset, or block, of the m bits from among the word of electronic data 158. Upon the edge of the CE#, the column decoder 110 latches k bits of the n bit address. Thereafter, the column decoder 110 provides block control signal 160 to activate a multiplexer from among the output multiplexer 108 which corresponds to the k bits of the n bit address. In an exemplary embodiment, the output multiplexer 108 includes sixteen 16-bit multiplexers that are configured to select blocks of 16 bits from among the 256 bits of the electronic data 158. Finally, the output multiplexer 108 provides the block of the m bits from among the word of electronic data 158 that corresponds to the k bits of the n bit address as a block of electronic data 162 in the read mode of operation.

The output latch 112 latches the block of electronic data 162 to provide a block of electronic data 164 in response to the OE# being driven from a first logical value, such as a logical one to provide an example, to a second logical value, such as a logical zero to provide an example.

The I/O Buffer 114 stores the block of electronic data 164 to provide a block of electronic data 166.

A Memory Having Integrated Capabilities to Measure Read Speed

Figure 2:
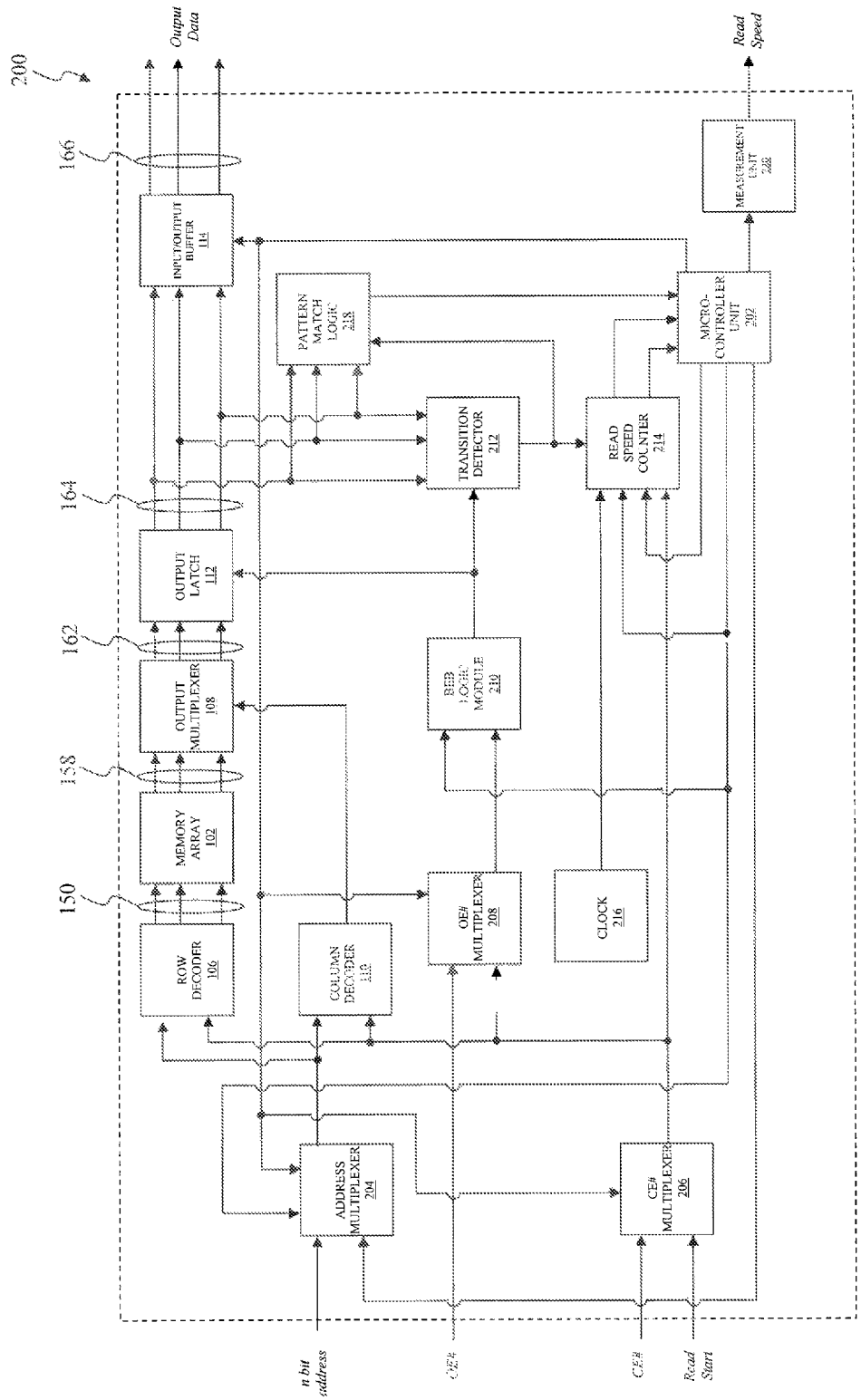
FIG. 2 illustrates a block diagram of a memory with integrated capabilities to measure read speed according to an exemplary embodiment of the present disclosure.

FIG. 2 illustrates a block diagram of a memory with integrated capabilities to measure read speed according to an exemplary embodiment of the present disclosure. In an exemplary embodiment, a memory 200 can operate in a normal mode of operation or a testing mode of operation. In the testing mode of operation, the memory 200 can measure various benchmarks of performance, such as read speed. The memory 200 can perform an asynchronous read operation to read a word of electronic data that corresponds to an address or a page read operation in which multiple asynchronous read operations are performed to read multiple words of electronic data, also referred to as a page of electronic data, that correspond to multiple addresses. The memory 200 can measure a time required, referred to as read speed, to read the word of electronic data or the multiple words of electronic data from the memory 200. In the normal mode of operation, the memory 200 can perform the asynchronous read operation, the page read operation, an asynchronous write operation in which a word of electronic data is stored into the memory 200 that correspond to the address, or a page write operation in which a page electronic data is stored into the memory 200 that correspond to the multiple addresses.

The memory 200 includes the memory array 102, the row decoders 106.1 through 106.($n-k$), the output multiplexer 108, the column decoder 110, the output latch 112, the input/output (I/O) buffer 114, a micro-controller unit (MCU) 202, an address multiplexer 204, a chip enable (CE#) multiplexer 206, an output enable (OE#) multiplexer 208, a backend enable block (BEB) logic module 210, a transition detector 212, a read speed counter 214, a clock generator 216, a pattern match logic module 218, and an measurement unit 220. In the normal mode of operation and/or the testing mode of operation, the memory array 102, the row decoders 106.1 through 106.($n-k$), the output multiplexer 108, the column decoder 110, the output latch 112, the input/output (I/O) buffer 114 operate in a substantially similar manner as described above in FIG. 1; therefore, only differences between operation of the memory array 102, the row decoders 106.1 through 106.($n-k$), the output multiplexer 108, the column decoder 110, the output latch 112, the I/O buffer 114 are to be described in further detail FIG. 2.

The MCU 202 controls overall operation and/or configuration of the memory 200. The MCU 202 configures the memory 200 to operate in the normal mode of operation and/or the testing mode of operation.

Normal Mode of Operation

Figure 3A:
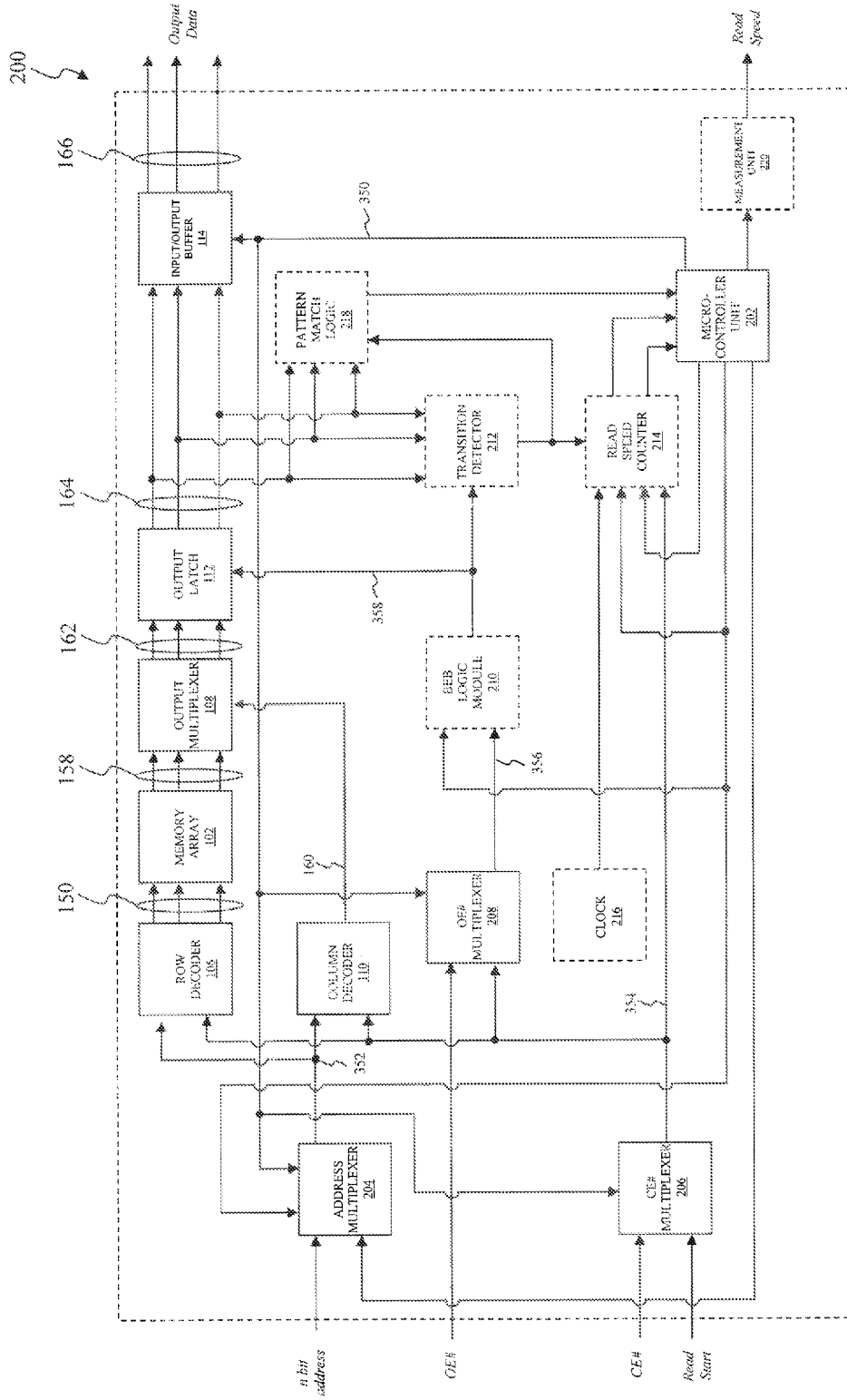
FIG. 3A illustrates a block diagram of the memory operating in a normal mode of operation according to an exemplary embodiment of the present disclosure.

FIG. 3A illustrates a block diagram of the memory operating in a normal mode of operation according to an exemplary embodiment of the present disclosure. The memory 200 can perform the asynchronous read operation or multiple asynchronous read operations, referred to as the page read operation, to provide electronic data that is stored within the memory array 102 to a first electrical, mechanical, and/or electro-mechanical device that is communicatively coupled to the memory 200.

As shown in the example of FIG. 3A, the transition detector 212, the read speed counter 214, the clock generator 216, the pattern match logic module 218, and the measurement unit 220 are deactivated or turned off as indicated by the "dashed" lines in the normal mode of operation. To enter into the normal mode of operation, the memory 200 defaults to reading array data after power-up (POR) of the memory 200, hardware (warm) reset of the memory 200, or a software reset command. To read data from the memory array 102, a valid address can be asserted onto the n-bit address by the first electrical, mechanical, and/or electro-mechanical device while driving OE# and CE# from the first logical value to the second logical value. A block of m bits that corresponds to the n-bit address can appear as the block of electronic data 164 after the address access time ($tA_{CC}$) and/or the chip enable access time ($t_{CE}$).

Asynchronous Read Operation in the Normal Mode of Operation

The address multiplexer 304 selects an n bit address from the first electrical, mechanical, and/or electro-mechanical device when the operational mode 350 is at a first logical value, such as a logic one to provide an example, indicating the memory 200 is to operate in the normal mode of operation to provide an n bit address 352. The CE# multiplexer 306 selects the CE# from the first electrical, mechanical, and/or electro-mechanical device when the operational mode 350 is at the first logical value. The address multiplexer 304 and the CE# multiplexer 306 provide the n bit address as an n bit address 352 and the CE# as the chip enable 354, respectively, when operating in the normal mode of operation.

The row decoder 106 and the column decoder 110 decode the n bit address 352 to provide the word control signals 150 and the block control signal 160, respectively, in a substantially similar manner as described in FIG. 1. Upon toggling the CE# from a first logical value, such as a logical one to provide an example, to a second logical value, such as a logical zero to provide an example, the memory array 102 reads the word of m bits electronic data 158 that corresponds to the word control signals 150 and the output multiplexer 108 accesses the block of the m bits from among the word of electronic data 158 to provide the block of electronic data 162 in a substantially similar manner as described in FIG. 1.

The OE# multiplexer 208 selects the OE# from the first electrical, mechanical, and/or electro-mechanical device when the operational mode 350 is at the first logical value to provide an output enable 356. The BEB logic module 210 provides the output enable 356 to the output latch 112 as an output enable 358. Upon toggling the OE# from the first electrical, mechanical, and/or electro-mechanical device to the logical value, the output latch 112 latches the block of electronic data 162 to provide the block of electronic data 164.

The I/O Buffer 114 stores the block of electronic data 166 to provide the block of electronic data 166 to the first electrical, mechanical, and/or electro-mechanical device in a substantially similar manner as described in FIG. 1 when the operational mode 350 is at the first logical value.

Page Read Operation in the Normal Mode of Operation

The first electrical, mechanical, and/or electro-mechanical device can increment and/or decrement one or more bits from among the n bit address after performing in the asynchronous read operation. Thereafter, the first electrical, mechanical, and/or electro-mechanical device can toggle the CE# and/or the OE# from the first logical value to the second logical value to read another block of the m bits from among the word of electronic data 158 to provide the block of electronic data 162 in a substantially similar manner as described in FIG. 1. The first electrical, mechanical, and/or electro-mechanical device can continue to increment and/or decrement the one or more bits from among the n bit address and toggle the CE# and/or the OE# until all of the m bits from among the word of electronic data 158 have been read.

Testing Mode of Operation

Figure 3B:
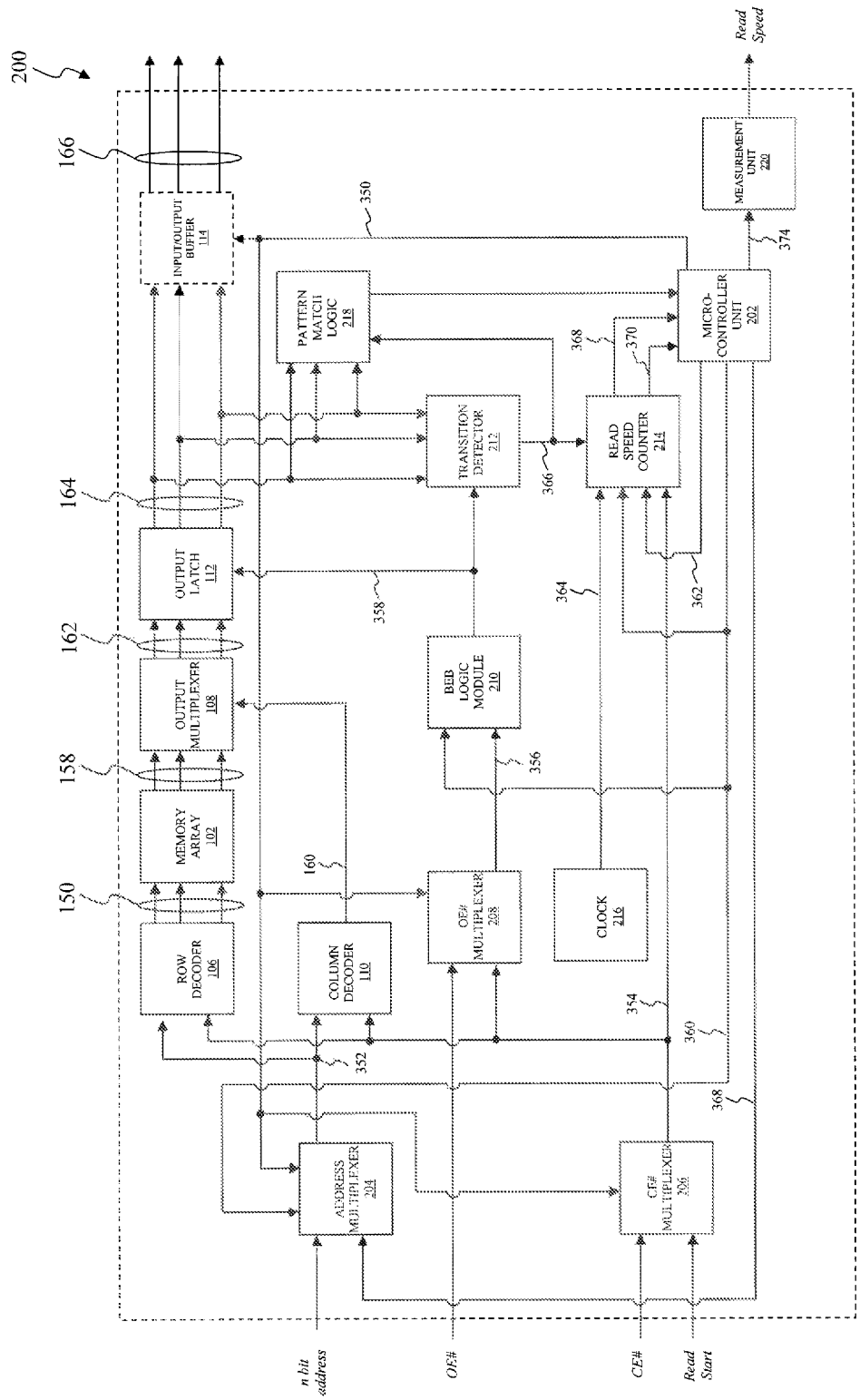
FIG. 3B illustrates a block diagram of the memory operating in a testing mode of operation according to an exemplary embodiment of the present disclosure.

FIG. 3B illustrates a block diagram of the memory operating in a testing mode of operation according to an exemplary embodiment of the present disclosure. As shown in FIG. 3B, the I/O Buffer 114 is deactivated or turned off when the operational mode 350 is at the second logical value as indicated by the "dashed" lines in the testing mode of operation. To enter into the testing mode of operation, the MCU 202 reads the read speed measurement from its internal memory upon powering up or turning on of the memory 200. The MCU 202 can configured the memory 200 to operate in the testing mode of operation when the read speed measurement value is at a second logical value, such as a logical one to provide an example. The MCU 202 provides the operational mode 350 that configures the address multiplexer 204, the CE# multiplexer 206, and the output enable OE# multiplexer 208 to operate in the testing mode of operation.

Asynchronous Read Operation in the Testing Mode of Operation

In an exemplary embodiment, the address multiplexer 304 selects an n bit address 368 from a second electrical, mechanical, and/or electro-mechanical device that is communicatively coupled to the memory when the operational mode 350 is at a second logical value, such as a logic zero to provide an example, to indicate the memory 200 is to operate in the testing mode of operation. The CE# multiplexer 306 provides a Read Speed from the second electrical, mechanical, and/or electro-mechanical device when the operational mode 350 is at the second logical value indicating that the memory 200 is to operate in the testing mode of operation. The address multiplexer 304 and the CE# multiplexer 306 provide the n bit address 368 as the n bit address 352 and the Read Speed as the chip enable 354, respectively, when operating in the testing mode of operation.

The row decoder 106 and the column decoder 110 decode the n bit address 352 to provide the word control signals 150 and the block control signal 160, respectively, in a substantially similar manner as described in FIG. 1. Upon toggling the Read Speed from the first logical value, such as a logical one to provide an example, to a second logical value, such as a logical zero to provide an example, the memory array 102 reads the word of m bits electronic data 158 that corresponds to the word control signals 150 and the output multiplexer 108 accesses the block of the m bits from among the word of electronic data 158 to provide the block of electronic data 162 in a substantially similar manner as described in FIG. 1.

The OE# multiplexer 208 selects the chip enable 354 when the operational mode 350 is at the second logical value to provide the output enable 356. The BEB logic module 210 provides the output enable 356 to the output latch 112 as the output enable 358. Upon toggling the Read Speed from the second electrical, mechanical, and/or electro-mechanical device from the first logical value to the second logical value, the output latch 112 latches the block of electronic data 162 to provide the block of electronic data 164.

Measurement of Read Speed of the Asynchronous Read Operation in the Testing Mode of Operation In an exemplary embodiment, when in the testing mode of operation, the MCU 202 configures the memory 200 to substantially simultaneously perform the asynchronous read operation while measuring the read speed of this operation. For example, the MCU 202 configures the memory 200 to substantially simultaneously perform the asynchronous read operation to read a block of m bits of electronic data 164 from the memory array while measuring the read speed of the memory 200 in reading the block of m bits of electronic data 164. The read speed of the memory 200 represents an address access time ($t_{ACC}$) which represents a delay from the n bit address 368 stabilizing until valid electronic data appears as the block of m bits of electronic data 164 or a chip enable access time ($t_{CE}$) which represents a delay from the falling edge of the Read Start until the valid electronic data appears as the block of m bits of electronic data 164.

The read speed counter 214 measures the read speed of the memory 200. As shown in FIG. 3B, a counter reset 362 from the MCU 202 resets or initializes the read speed counter 214 to an initial state, such as zero to provide an example. Thereafter, the second electrical, mechanical, and/or electro-mechanical device drives the Read Start from the first logical value to the second logical value to start the read speed counter 214 to begin its counting processing using a clocking signal 364 from the clock generator 216. The read speed counter 214 continues its counting process until receiving a read complete 366 from the transition detector 212. Upon receiving the read complete 366, the read speed counter 214 stops its counting process at a final state and provides a difference between the final state and the initial state as a read speed 368 to the MCU 202. Optionally, the read speed counter 214 can compare the read speed 368 to a threshold and provide a read speed valid 370 to the MCU 202 which indicates that the read speed is within an acceptable manufacturer specification for the read speed.

The transition detector 212 provides the read complete 366 when the valid electronic data appears as the block of m bits of electronic data 164. The transition detector 212 measures for transitions within outputs of the output latch 112 and causes the read speed counter 214 to stop its counting process at the final state once each of outputs of the output latch 112 have transitioned between logical values. Specifically, the output enable 358 initializes multiple transition detector modules within the transition detector 212 to provide first detection signals. Each bit from among the block of m bits of electronic data 164 causes a corresponding transition detector module from among the multiple transition detector modules to provide a second detection signal indicating that the bit has been read from the memory array 102 and latched by the output latch 112. When all of the multiple transition detector modules have transitioned to the second detection signal, the transition detector 312 provides a read complete 366 indicating that the block of m bits of electronic data 164 has been read from the memory array 102 and latched by the output latch 112.

The pattern match logic 218 matches the block of m bits of electronic data 164 with a predetermined pattern of m bits upon receiving the read complete 366. Specifically, the second electrical, mechanical, and/or electro-mechanical device can write a first predetermined pattern of m bits, such as a checkerboard, a reverse checkerboard, all logical zeros, and/or all logical ones to provide some examples, into the memory array 102. The pattern match logic 218 can compare the block of m bits of electronic data 164 with a second predetermined pattern of m bits that corresponds to the first predetermined pattern of data. The pattern match logic 218 can provide a pattern match indicator 372 whose value indicates whether the second predetermined pattern of m bits matches the block of m bits of electronic data 164.

The optional measurement unit 220 can provide one or more measurements of the read speed of the memory 200 as the Read Speed. For example, the MCU 202 can timestamp the read speed 368 to provide a read speed 374. In this example, the read speed 374 can also include the read speed valid 370 and the pattern match indicator 372. In this example, the optional measurement unit 220 can store a read speed 374 for multiple asynchronous read operations in an asynchronous read table and provide the asynchronous read table as the Read Speed to the second electrical, mechanical, and/or electro-mechanical device.

Page Read Operation in the Testing Mode of Operation

In an exemplary embodiment, the address multiplexer 204 can increment and/or decrement one or more bits from among the n bit address 360 when a page read 360 from the MCU 202 toggles from a first logical value, such as logical one to provide an example, to a second logical value, such as a logical zero to provide an example. Thereafter, the second electrical, mechanical, and/or electro-mechanical device can toggle the Read Start from the first logical value to the second logical value to read another block of m bits of electronic data 164 in a substantially similar manner as described in FIG. 1. Additionally, the page read 360 causes the BEB logic module 210 to provide the output enable 358 when its toggles from the first logical value to the second logical value to cause the output latch 112 to latch another block of m bits of electronic data 164. The address multiplexer 204 and the second electrical, mechanical, and/or electro-mechanical device can continue to increment and/or decrement the one or more bits from among the n bit address 360 and toggle the Read Start until all of the m bits, referred to as a page, from among the word of electronic data 158 have been read.

Measurement of Page Read Speed in the Testing Mode of Operation

In an exemplary embodiment, when in the testing mode of operation, the MCU 202 configures the memory 200 to substantially simultaneously perform the page read operation while measuring the read speed of this operation. For example, the MCU 202 configures the memory 200 to substantially simultaneously perform the page read operation to read m bits of electronic data 164 from the memory array while measuring the read speed of the memory 200 in reading the m bits of electronic data 164. The memory 200 operates in a substantially similar manner to measure the page read speed as the asynchronous read speed; therefore only differences between measuring the page read speed and the asynchronous read speed are described in further detail.

The page read 360 causes the BEB logic module 210 to provide the output enable 358 when its toggles from the first logical value to the second logical value to initialize the multiple detectors within the transition detector 212 to determine when the valid electronic data appears as another block of m bits of electronic data 164.

The read speed counter 214 can re-start the counting process in response to the page read 360 to measure the read speed of block of m bits of electronic data 164. Upon receiving the read complete 366, the read speed counter 214 stops its counting process and provides the read speed 368 to the MCU 202. The read speed counter 214 can be started and stopped multiple times until the read speed of all of the m bits from among the word of electronic data 158 have been measured.

Exemplary Transition Detector that can be Used in the Memory

Figure 4:
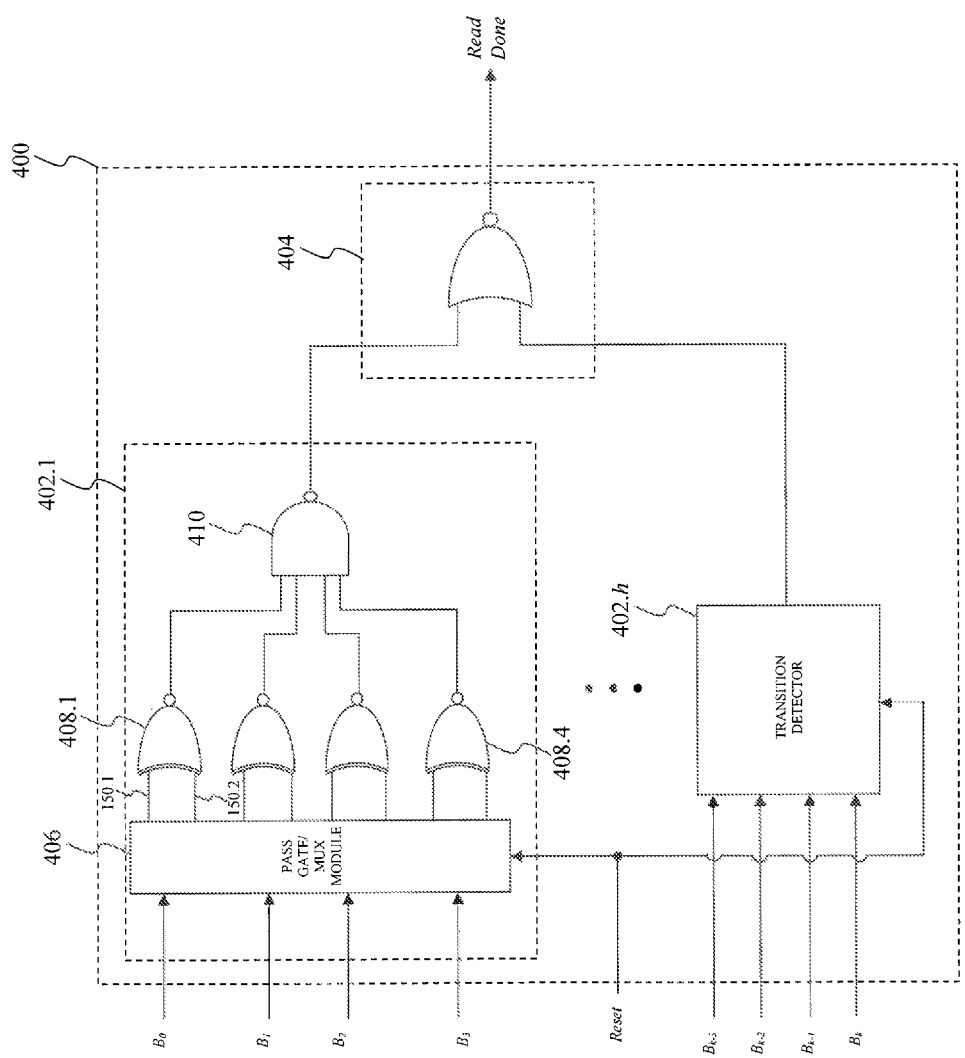
FIG. 4 illustrates a block diagram of a transition detector that can be used within the memory to measure read speed according to an exemplary embodiment of the present disclosure.

FIG. 4 illustrates a block diagram of a transition detector that can be used within the memory to measure read speed according to an exemplary embodiment of the present disclosure. A transition detector 400 includes multiple transition detectors that are initialized to provide first detection signals. Each bit from among a block of bits of electronic data causes a corresponding detector from among the multiple detectors to provide a second detection signal indicating that the bit has been read from a memory array and latched by an output latch. When all of the multiple detectors have transitioned to the second detection signal, the transition detector 400 provides a read complete indicating that the block of bits of electronic data has been read from the memory array and latched by the output latch. The transition detector 400 includes transition detector modules 402.1 through 402.h and a computation module 404. The transition detector 400 can represent an exemplary embodiment of the transition detector 212.

The transition detector modules 402.1 through 402.h determine whether bits $B_0$ through $B_K$ have transitioned between logical values. For example, the transition detector modules 402.1 through 402.h determine whether bits $B_0$ through $B_K$ have transitioned from a first logical value, such as a logical one to provide an example, to a second logical value, such as a logical zero to provide an example, or from the second logical value to the first logical value. The transition detector modules 402.1 through 402.h can be implemented in a substantially similar manner; therefore, only the transition detector module 402.1 is discussed in further detail below.

The transition detector module 402.1 detects for transitions in a first group of bits $B_0$ through $B_3$ from among the bits $B_0$ through $B_K$. The transition detector module 402.1 includes a pass-gate/multiplexer module 406, logical exclusive nor (XNOR gates) 408.1 through 408.4, and a logical NAND gate 410. An output latch, such as the output latch 112 to provide an example, initializes inputs of the logical XNOR gates 408.1 through 408.4 in response to receiving a Reset such as the output enable 358 to provide an example. Upon toggling the Reset from a first logical value, such as a logical one to provide an example, to a second logical value, such as logical zero to provide an example, the output latch, initializes a first input 150.1 of the logical XNOR gate 408.1 to be a logical one and a second input 150.2 of the logical XNOR gate 408.1 to be a logical zero. The output latch, can initialize other inputs of other XNOR gates 408.2 through 408.4 in a substantially similar manner. Upon receiving the bit $B_0$, the pass-gate/multiplexer module 406 toggles the first input 150.1 of the logical XNOR gate 408.1 from logical one to logical zero when the bit $B_0$ transitions from a logical zero to a logical one or toggles the second input 150.2 of the logical XNOR gate 408.1 from logical zero to logical one when the bit $B_0$ transitions from the logical one to the logical zero.

The logical XNOR gates 408.1 through 408.4 provide logical ones when both of their respective inputs are substantially similar logical values which indicate their respective bits $B_0$ through $B_3$ have transitioned between logical values. Otherwise, the logical XNOR gates 408.1 through 408.4 provide logical zeros when both of their respective inputs are different logical values which indicate their respective bits $B_0$ through $B_3$ have not transitioned between logical values.

The logical NAND gate 410 provides a logical zero when all of its respective inputs are at similar logical values which indicate that all of the first group of bits $B_0$ through $B_3$ from among the bits $B_0$ through $B_K$ has transitioned between logical values. Otherwise, the logical NAND gate 410 provides a logical one when one or more of its respective inputs are different logical values which indicate one or more of the first group of bits $B_0$ through $B_3$ from among the bits $B_0$ through $B_K$ has not transitioned between logical values.

The computation module 404 toggles a read done signal, such as the read complete 366 to provide an example, from a first logical value, such as a logical zero to provide an example, to a second logical value, such as logical one to provide an example, when each group of bits from among the bits $B_0$ through $B_K$ have transitioned between logical values.

Exemplary Operation of the Memory

Figure 5:
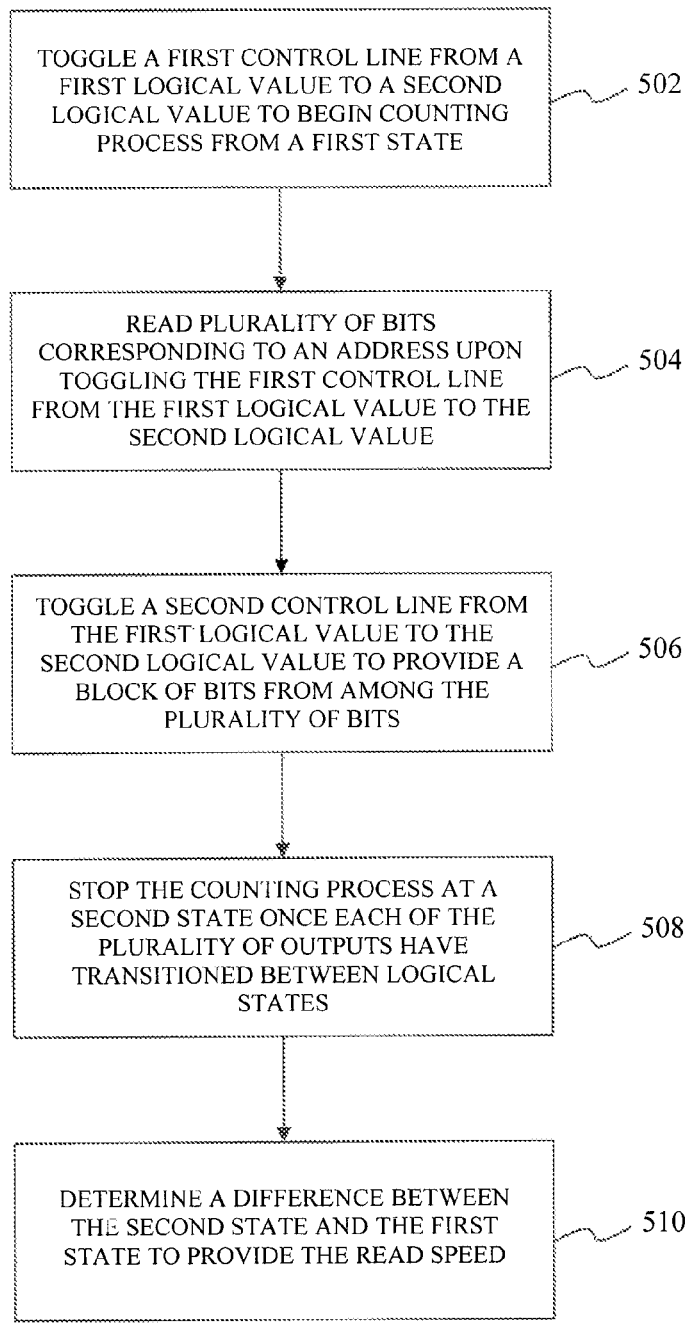
FIG. 5 is a flowchart of exemplary operational steps of the memory according to an exemplary embodiment of the present invention.

FIG. 5 is a flowchart of exemplary operational steps of the memory according to an exemplary embodiment of the present invention. The invention is not limited to this operational description. Rather, it will be apparent to persons skilled in the relevant art(s) from the teachings herein that other operational control flows are within the scope and spirit of the present invention. For illustrative purposes, the following discussion refers to FIG. 3B, although FIG. 5 is not limited to this example.

At step 502, the operational control flow toggles a first control line from a first logical value to a second logical value to begin a counting process from a first state. The operational control flow toggles a Read Start from the first logical value to the second logical value.

At step 504, the operational control flow reads a plurality of bits corresponding to an address upon toggling the first control line from the first logical value to the second logical value. Upon toggling the Read Speed from a first logical value, such as a logical one to provide an example, to a second logical value, such as a logical zero to provide an example, the operational control flow reads a word of electronic data that corresponds to an n bit address.

At step 506, the operational control flow toggles a second control line from the first logical value to the second logical value to provide a block of bits from among the plurality of bits. Upon toggling an output enable 358 from the first logical value to the second logical value, the operational control flow latches a block of bits from among the word of electronic data.

At step 508, the operational control flow stops the counting process at a second state once each of the plurality of outputs have transitioned between logical values.

At step 510, the operational control flow determines a difference between the second state and the first state to provide the read speed.

CONCLUSION

It is to be appreciated that the Detailed Description section, and not the Abstract section, is intended to be used to interpret the claims. The Abstract section may set forth one or more, but not all exemplary embodiments, of the present disclosure, and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus the present disclosure should not be limited by any of the above-described exemplary embodiments, but should be defined only in accordance with the following claims and their equivalents.

What is claimed is:

1. A memory with integrated capabilities to measure read speed, comprising:
a read speed counter configured to begin a counting process from a first state upon toggling of a first control line from a first logical value to a second logical value;
a memory array configured to read a plurality of bits corresponding to an address upon the toggling of the first control line from the first logical value to the second logical value;
an output latch configured to provide a block of bits from among the plurality of bits upon toggling a second control line from the first logical value to the second logical value; and
a transition detector configured to stop the counting process at a second state once each of a plurality of outputs of the output latch have transitioned between logical values,
wherein a difference between the second state and the first state represents the read speed.

2. The memory of claim 1, wherein the memory array comprises:
a plurality of memory cells configured and arranged as a plurality of rows of bits and a plurality of columns of words to form an array.

3. The memory of claim 2, further comprising:
a plurality of row decoders configured to access the plurality of bits from among the plurality of memory cells that correspond to a first portion of the address; and
a column decoder configured to access the block of bits from among the plurality of bits that corresponds to a second portion of the address.

4. The memory of claim 1, further comprising:
a micro-controller unit configured to cause the memory to measure the read speed in a testing mode of operation or to cause the memory to perform a read operation in a normal mode of operation.

5. The memory of claim 4, further comprising:
an input/output buffer configured to provide the block of bits to a device communicatively coupled to the memory in the normal mode of operation or to not provide the block of bits to the device when the memory is in the testing mode of operation.

6. The memory of claim 1, further comprising:
a pattern match logic module configured to match the block of bits with a predetermined pattern of bits.

7. The memory of claim 1, wherein the transition detector comprises:
a plurality of transition detector modules configured to detect for transitions between the logical values of each of the plurality of outputs; and
a computation configured to stop the counting process at the second state once each of the plurality of outputs have transitioned between the logical values.

8. The memory of claim 7, wherein the output latch is further configured to provide a first plurality of input signals at the first logical value and a second plurality of input signals at the second logical value in response to a reset signal, and
wherein at least one of the plurality of transition detector modules comprises:
a pass-gate/multiplexer module configured to toggle a corresponding input signal from among the first plurality of input signals to the second logical value when its corresponding bit from among a group of bits from among of the block of bits is at the second logical value and to toggle a corresponding input signal from among the second plurality of input signals to the first logical value when its corresponding bit from among the group of bits from among the block of bits is at the first logical value;
a plurality of logical XNOR gates, each of the plurality of XNOR gates being configured to perform an exclusive nor logical function upon corresponding input signals from among the first plurality of input signals and the second plurality of input signals; and
a logical NAND gate configured to provide the second logical value as an output when all bits from among the group of bits from among of the block of bits have transitioned between the logical values.

9. A method for measuring a read speed of a memory, comprising:
toggling a first control line from a first logical value to a second logical value to begin counting process from a first state;
reading a plurality of bits corresponding to an address upon the toggling the first control line from the first logical value to the second logical value;
toggling a second control line from the first logical value to the second logical value to provide a block of bits from among the plurality of bits;
stopping the counting process at a second state once each of the plurality of outputs have transitioned between logical values; and
determining a difference between the second state and the first state to provide the read speed.

10. The method of claim 9, wherein the reading the plurality of bits comprises:
accessing the plurality of bits from the memory that correspond to a first portion of the address; and
accessing the block of bits from among the plurality of bits that corresponds to a second portion of the address.

11. The method of claim 9, further comprising:
configuring the memory to operate in a testing mode of operation to measure the read speed or in a normal mode of operation to perform a read operation.

12. The method of claim 11, further comprising:
providing the block of bits to a device communicatively coupled to the memory in the normal mode of operation or not providing the block of bits to the device when the memory is in the testing mode of operation.

13. The method of claim 9, further comprising:
matching the block of bits with a predetermined pattern of bits.

14. The method of claim 9, wherein the stopping the counting process at the second state comprises:
detecting for transitions between the logical values of each of the plurality of outputs; and
stopping the counting process at the second state once each of the plurality of outputs have transitioned between the logical values.

15. The memory of claim 14, wherein the detecting for transitions comprises:

generating a first plurality of input signals at the first logical value and a second plurality of input signals at the second logical value in response to a reset signal;

toggling a corresponding input signal from among the first plurality of input signals to the second logical value when its corresponding bit from among a group of bits from among of the block of bits is at the second logical value;

toggling a corresponding input signal from among the second plurality of input signals to the first logical value when its corresponding bit from among the group of bits from among the block of bits is at the first logical value;

performing an exclusive nor logical function upon corresponding input signals from among the first plurality of input signals and the second plurality of input signals; and providing the second logical value as an output when all bits from among the group of bits from among of the block of bits have transitioned between the logical values.

16. A memory with integrated capabilities to measure read speed, comprising:

a micro-controller unit configured to cause the memory to operate in a normal mode of operation to perform a read operation or in a testing mode of operation to measure the read speed;

a memory array configured to read a plurality of bits corresponding to an address upon toggling a first control line from the first logical value to the second logical value in the normal mode of operation and the testing mode of operation;

an output latch configured to provide a block of bits from among the plurality of bits upon toggling a second control line from the first logical value to the second logical value in the normal mode of operation and the testing mode of operation;

an input/output buffer configured to provide the block of bits to a device communicatively coupled to the memory in the normal mode of operation or to not provide the block of bits to the device when the memory is in the testing mode of operation;

a read speed counter configured to begin a counting process from a first state upon the toggling of the first control line from the first logical value to the second logical value in the testing mode of operation; and a transition detector configured to stop the counting process at a second state once each of the plurality of outputs have transitioned between logical values in the testing mode of operation, wherein a difference between the second state and the first state represents the read speed.

17. The memory of claim 16, wherein the memory array comprises:

a plurality of memory cells configured and arranged as a plurality of rows of bits and a plurality of columns of words to form an array.

18. The memory of claim 17, further comprising:

a plurality of row decoders configured to access the plurality of bits from among the plurality of memory cells that correspond to a first portion of the address; and a column decoder configured to access the block of bits from among the plurality of bits that corresponds to a second portion of the address.

19. The memory of claim 16, wherein the transistor detector comprises:

a plurality of transition detector modules configured to detect for transitions between the logical values of each of the plurality of outputs; and a computation configured to stop the counting process at the second state once each of the plurality of outputs have transitioned between the logical values.

20. The memory of claim 19, wherein the output latch is further configured to provide a first plurality of input signals at the first logical value and a second plurality of input signals at the second logical value in response to a reset signal, and wherein at least one of the plurality of transition detector modules comprises:

a pass-gate/multiplexer module configured to toggle a corresponding input signal from among the first plurality of input signals to the second logical value when its corresponding bit from among a group of bits from among of the block of bits is at the second logical value and to toggle a corresponding input signal from among the second plurality of input signals to the first logical value when its corresponding bit from among the group of bits from among the block of bits is at the first logical value;

a plurality of logical XNOR gates, each of the plurality of XNOR gates being configured to perform an exclusive nor logical function upon corresponding input signals from among the first plurality of input signals and the second plurality of input signals; and a logical NAND gate configured to provide the second logical value as an output when all bits from among the group of bits from among of the block of bits have transitioned between the logical values.

* * * * *

UNITED STATES PATENT AND TRADEMARK OFFICE
CERTIFICATE OF CORRECTION

| | | |
|---|---|---|
| PATENT NO. | : 8,964,484 B2 | Page 1 of 1 |
| APPLICATION NO. | : 13/729153 | |
| DATED | : February 24, 2015 | |
| INVENTOR(S) | : Ong et al. | |

It is certified that error appears in the above-identified patent and that said Letters Patent is hereby corrected as shown below:

On the title page, item (54), and in the specification, column 1, Title:

"FOR TEST (DFT) READ SPEED THROUGH TRANSITION DETECTOR IN BUILT-IN SELF-TEST (BIST) SORT" should read --DESIGN FOR TEST (DFT) READ SPEED THROUGH TRANSITION DETECTOR IN BUILT-IN SELF-TEST (BIST) SORT--

Signed and Sealed this
Twenty-sixth Day of May, 2015

Michelle K. Lee
*Director of the United States Patent and Trademark Office*